US007379376B2

(12) United States Patent
Oh et al.

(10) Patent No.: US 7,379,376 B2
(45) Date of Patent: May 27, 2008

(54) INTERNAL ADDRESS GENERATOR

(75) Inventors: Seung-Min Oh, Kyoungki-do (KR); Yong-Bok An, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 112 days.

(21) Appl. No.: 11/478,083

(22) Filed: Jun. 30, 2006

(65) Prior Publication Data

US 2007/0070781 A1 Mar. 29, 2007

(30) Foreign Application Priority Data

Sep. 28, 2005 (KR) ..................... 10-2005-0090860
Dec. 29, 2005 (KR) ..................... 10-2005-0133961

(51) Int. Cl.
*G11C 8/00* (2006.01)

(52) U.S. Cl. .......................... 365/230.06; 365/230.08; 365/233

(58) Field of Classification Search ........... 365/230.06, 365/230.08, 233
See application file for complete search history.

(56) References Cited

U.S. PATENT DOCUMENTS

| | | | |
|---|---|---|---|
| 5,787,045 A | 7/1998 | Lee | |
| 6,310,823 B1 * | 10/2001 | Nam | 365/193 |
| 6,570,802 B2 | 5/2003 | Ohtsuka et al. | |
| 6,839,291 B2 * | 1/2005 | Shin | 365/194 |
| 6,906,970 B2 | 6/2005 | Kim et al. | |
| 2002/0057616 A1 | 5/2002 | Ohtsuka et al. | |
| 2006/0245277 A1 | 11/2006 | Lee | |

FOREIGN PATENT DOCUMENTS

| | | |
|---|---|---|
| JP | 2000-011638 | 1/2000 |
| JP | 2000-57777 A | 2/2000 |
| KR | 10-2001-0083253 | 8/2001 |
| KR | 10-2005-0035637 | 4/2005 |
| KR | 10-2006-0113302 | 11/2006 |

OTHER PUBLICATIONS

Korean Office Action issued in corresponding Korean Patent Application No. KR 2005-13396, dated Dec. 13, 2006.

Korean Office Action, issued in corresponding Korean Patent Application No. KR 10-2005-0133961, dated on Jun. 27, 2007.

* cited by examiner

*Primary Examiner*—VanThu Nguyen
(74) *Attorney, Agent, or Firm*—McDermott Will & Emery LLP

(57) ABSTRACT

An internal address generator includes a plurality of column address generators, a mode column address generator, and a drive clock generator. Each column generator receives a corresponding address, an additive latency, and a CAS latency to generate an internal read address in response to a read drive clock and generate an internal write address in response to a write drive clock. The mode column address generator receives a corresponding address, the additive latency, and the CAS latency to generate a mode read address in response to a band width read drive clock and generate a mode write address in response to a band width write drive clock. The drive clock generator receives an additive latency signal, a band width signal, a write enable signal, and a clock to generate the read drive clock, the write drive clock, the band width read drive clock, and the band width write drive clock.

25 Claims, 6 Drawing Sheets

200
210
220
222
222a
222b
224
230
240
250
260
270
280
TG1
TG2
TG3
TG4
TG5
CKDRD
ADD<0>
AL<0>
AL<1>
AL<5>
RDCOL<0>
CKDWT
CL<2>
CL<3>
CL<6>
WTCOL<0>

600
610
620
640
650
RDCOL<11>
AL<5>
AL<1>
AL<0>
CKDRD11
ADD<11>
660
670
680
690
WTCOL<11>
CL<6>
CL<3>
CL<2>
CKDWT11

INTERNAL ADDRESS GENERATOR

FIELD OF THE INVENTION

The present invention relates to an internal address generator; and, more particularly, to an internal address generator for reducing power consumption.

DESCRIPTION OF RELATED ARTS

Conventionally, a DRAM includes a mode register set (MRS) and an extended mode register set (EMRS) in order to properly set the DRAM according to user circumstance. A DDR2 typically sets an additive latency AL and a column address strobe (CAS) latency CL, respectively, through the MRS and the EMRS. Herein, the CAS latency CL set by the MRS denotes a delay caused by internal logic of the DDR2. Because the delay caused by internal logic of the DDR2 does not change according to an operation frequency, the CAS latency CL is required for the DDR2 to perform reliably. The additive latency AL set by the EMRS is for increasing data bus efficiency by inputting a command within a minimum RAS to CAS delay.

In a read operation, an internal read command for the actual read operation is activated after the latency AL period added to the read command input. In a write operation, an internal write command for performing the actual write operation is activated after the latency AL period added to the write command input. Further, an address inputted with the read command or the write command is delayed after a predetermined delay to be generated as an internal column address.

FIG. 1 is a block diagram of a conventional internal address generator.

The conventional internal address generator includes eleven column address generators 10 to 50. Each of the internal address generators 10 to 50 has the same structure. Each internal address generator, e.g., 10, receives an internal clock CKD, corresponding additive latency, e.g., AL<0>, corresponding CAS latency, e.g., CL<2>, and corresponding address, e.g., ADD<0> to thereby generate a read address RDCOL and a write address WTCOL.

FIG. 2 is a schematic circuit diagram of a first column address generator 10, shown in FIG. 1.

The first column address generator 10 includes a read address generator 11 for generating the first read address RDCOL<0> by delaying the first address ADD<0> as for a delay time determined by the additive latency AL and a write address generator 15 for generating the first write address WTCOL<0> by delaying the first read address RDCOL<0> for a delay time determined by the CAS latency CL.

The read address generator 11 includes a read delaying unit 12, a read selecting unit 13, and a read output unit 14. The read delaying unit 12 delays first address ADD<0> in response to the internal clock CKD to thereby output first to fifth delay addresses ADD<0>_1 to ADD<0>_5. For example, the first delay address ADD<0>_1 is generated by delaying the first address ADD<0> for one internal clock. In the same way, the fifth delay address ADD<0>_5 is generated by delaying the first address ADD<0> for five internal clocks. The read selecting unit 13 selects one of the first address ADD<0> and the first to the fifth delay addresses ADD<0>_1 to ADD<0>_5 in response to the additive latency AL<0:5> to output as an additive address. The read output unit 14 latches the additive address to output as the first read address RDCOL<0>.

The write address generator 15 includes a write delaying unit 16, a write selecting unit 17, and a write output unit 18. The write delaying unit 16 delays the first read address RDCOL<0> in response to the internal clock CKD to thereby output first to fourth delay read addresses RDCOL<0>_1 to RDCOL<0>_4. For example, the first delay read address RDCOL<0>_5 is generated by delaying the first read address RDCOL<0> for one internal clock. In the same way, the fourth delay read address RDCOL<0>_4 is generated by delaying the first read address RDCOL<0> for four internal clocks. The write selecting unit 17 selects one of the first read address RDCOL<0> and the first to the fourth delay read addresses RDCOL<0>_1 to RDCOL<0>_4 in response to the CAS latency CL<2:6> to output as a CAS address. The write output unit 18 latches the CAS address to output the first write address WTCOL<0>.

Operation of the first column address generator 10 is described below as an illustrative example in the additive latency AL is three, the CAS latency CL is five, and the write command is input.

After the write command and the first address ADD<0> are input, the read delaying unit 12 in the first column address generator 10 outputs the first to the fifth delay addresses ADD<0>_1 to ADD<0>_5 in response to the internal clock CKD. The read selecting unit 13 selects the third delay address ADD<0>_3 in response to the fourth additive latency AL<3> because the additive latency AL is three. The read output unit 14 latches the additive address to output as the first read address RDCOL<0>.

The write delaying unit 16 in the write address generator 15 outputs the first to fourth delay read addresses RDCOL<0>_1 to RDCOL<0>_4 in response to the internal clock CKD. The write selecting unit 17 selects the third delay read addresses RDCOL<0>_3 in response to the fourth CAS latency CL<5> because the CAS latency CL is five. The write output unit 18 latches the CAS address to output as the first write address WTCOL<0>.

If the read command is input with the first address ADD<0>, the first column address generator 10 generates the first read address RDCOL<0>.

Herein, the additive latency is zero. Therefore, the first additive latency AL<0> is activated as a logic high level and the other additive latencies AL<1:5> are inactivated as a logic low level.

After the read command and the first address ADD<0> are input, the read delaying unit 12 in the first column address generator 10 outputs the first to the fifth delay addresses ADD<0>_1 to ADD<0>_5 in response to the internal clock CKD. The read selecting unit 13 selects the first address ADD<0> in response to the first additive latency AL<0> because the additive latency AL is zero. The read output unit 14 latches the additive address to output as the first read address RDCOL<0>.

The abovementioned read and write operations are commonly performed in the other column address generators 20 to 50.

The conventional internal address generator shown in FIG. 1 may produce unnecessary power consumption. When an address is input with the read command and, therefore, a read address is to be outputted, the write address generator 15 for outputting a write address is also driven. Further, when the additive latency AL is zero, the first address ADD<0> is output as the first read address RDCOL<0> without delay. Therefore, the read delaying unit 12 is not required to be driven when the additive latency AL is zero. However, the conventional internal address generator drives the read delay unit 12 in response to the internal clock CKD without regard to whether or not the additive latency AL is zero.

Still further, the column address generator 50 receiving the twelfth address ADD<11> is only required to be driven when an output mode of semiconductor device is X4, i.e., when the bit number of an output data of the semiconductor device is four. When the output mode is X8 or X16, i.e., when the bit number of the output data of the semiconductor device is eight or sixteen, only the column address generators 10 to 40 are used in order to generate read addresses RDCOL<0> to RDCOL<9> and write addresses WTCOL<0> to WTCOL<9>. However, the conventional internal address generator drives all column address generators 10 to 50 without regard to the output mode. Thus, the conventional internal address generator shown in FIG. 1 consumes power unnecessarily.

SUMMARY OF THE INVENTION

It is, therefore, an object of the present invention to provide an internal address generator for reducing power consumption by selectively activating drive clocks according to an operation mode and an output mode.

In accordance with an aspect of the present invention, there is provided an internal address generator including a plurality of column address generators, a mode column address generator, and a drive clock generator.

Each column generator receives a corresponding address, an additive latency, and a column address strobe (CAS) latency to thereby generate an internal read address in response to a read drive clock and generate an internal write address in response to a write drive clock. The mode column address generator receives a corresponding address, the additive latency, and the CAS latency to thereby generate a mode read address in response to a band width read drive clock and generate a mode write address in response to a band width write drive clock. The drive clock generator receives an additive latency signal, a band width signal, a write enable signal, and a clock to thereby generate the read drive clock, the write drive clock, the band width read drive clock, and the band width write drive clock.

The band width signal determines the bit numbers of an output data and the write enable signal is activated during a write operation.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an internal address generator in accordance with the present invention will be described in detail referring to the accompanying drawings.

Figure 3:
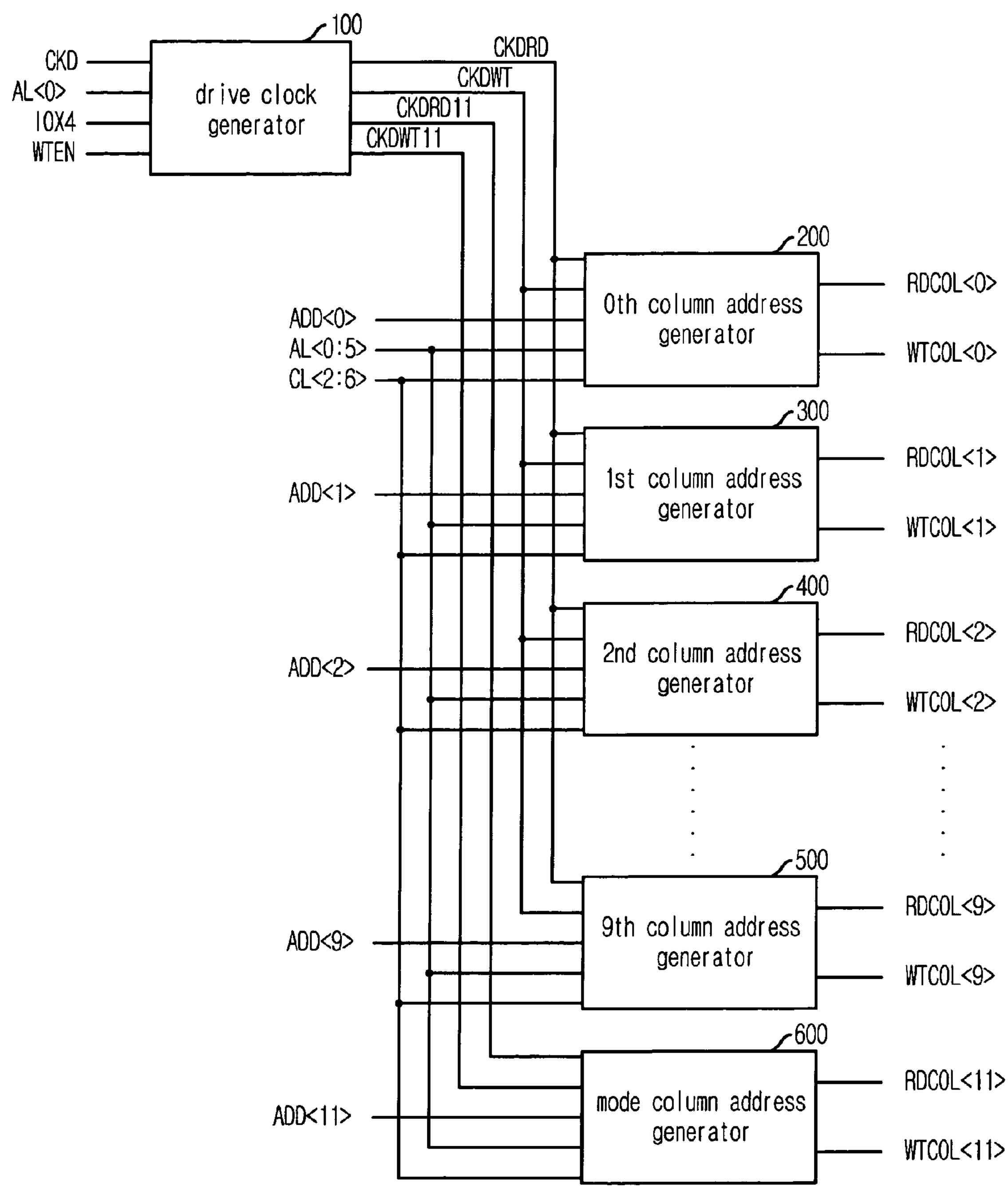
FIG. 3 is a block diagram of an internal address generator in accordance with an embodiment of the present invention.

FIG. 3 is a block diagram of an internal address generator in accordance with an embodiment of the present invention.

The internal address generator includes ten column address generators 200 to 500. Each column address generator, e.g., 200, receives a corresponding address, e.g., a first address ADD<0>, an additive latency AL<0:5>, and a CAS latency CL<2:6>. Each column address generator, e.g., 200, generates an internal read address RDCOL by delaying the address ADD for corresponding additive latency AL in response to a read drive clock CKDRD and generates an internal write address WTCOL by delaying the internal read address RDCOL for corresponding CAS latency CL in response to a write drive clock CKDWT.

For example, the first column address generator 200 generates a first internal read address RDCOL<0> by delaying the first address ADD<0> for corresponding additive latency AL in response to the read drive clock and generates a first internal write address WTCOL<0> by delaying the first read address RDCOL<0> for corresponding CAS latency in response to the write drive clock CKDWT.

The internal address generator further includes a mode column address generator 600 receiving a twelfth address ADD<11>, the additive latency AL<0:5>, and the CAS latency CL<2:6>. The mode column address generator 600 generates a twelfth internal read address RDCOL<11> by delaying the twelfth address ADD<11> for a corresponding additive latency AL in response to a band width read drive clock CKDRD11 and generates a twelfth internal write address WTCOL<11> by delaying the twelfth internal read address RDCOL<11> for a corresponding CAS latency CL in response to a band width write drive clock CKDWT11.

Further, the internal address generator includes a drive clock generator 100 for receiving the first additive latency AL<0>, a band width signal IOX4, a write enable signal WTEN, and an internal clock CKD. The drive clock generator 100 generates the read drive clock CKDRD, the write drive clock CKDWT, the band width read drive clock CKDRD11, and the band width write drive clock CKDWT11. Herein, the band width signal IOX4 is activated when the output mode is X4.

Figure 4:
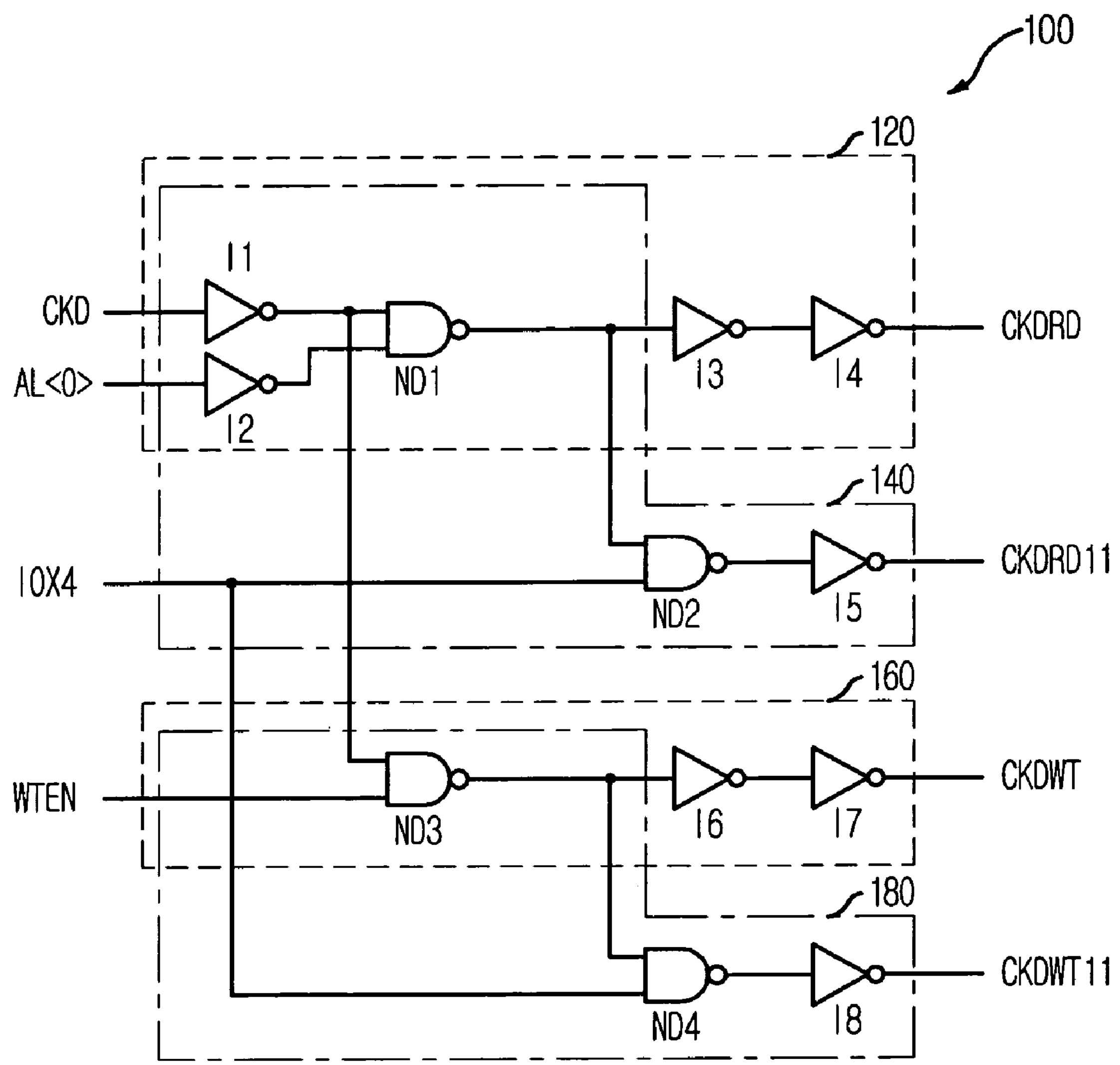
FIG. 4 is a schematic circuit diagram of a drive clock generator shown in FIG. 3.

FIG. 4 is a schematic circuit diagram depicting the drive clock generator 100 shown in FIG. 3.

As shown, the drive clock generator includes a read drive clock generator 120, a band width read drive clock generator 140, a write drive clock generator 160, and a band width write drive clock generator 180.

The read drive clock generator 120 outputs the internal clock CKD as the read drive clock CKDRD in response to an activation of the first additive latency AL<0>. The band width read drive clock generator 140 outputs the internal clock CKD as the band width read drive clock CKDRD11 in response to activations of the first additive latency AL<0> and the band width signal IOX4. The write drive clock generator 160 outputs the internal clock CKD as the write drive clock CKDWT in response to an activation of the write enable signal WTEN. The band width write drive clock generator 180 outputs the internal clock CKD as the band width write drive clock CKDWT11 in response to activations of the first additive latency AL<0> and the band width signal IOX4.

The read drive clock generator 120 includes a first inverter I1 for inverting the internal clock CKD, a second inverter I2 for inverting the first additive latency AL<0>, a first NAND gate ND1 for receiving outputs from the first and the second inverters, and a first inverter chain, provided with two inverters I3 and I4, for delaying an output of the first NAND gate ND1 to thereby output the read drive clock CKDRD.

The band width read drive clock generator 140 includes the first inverter I1 for inverting the internal clock CKD, the second inverter I2 for inverting the first additive latency AL<0>, the first NAND gate ND1 for receiving outputs from the first and the second inverters I1 and I2, a second NAND gate ND2 for receiving an output of the first NAND gate ND1 and the band width signal IOX4, and a fifth inverter I5 for inverting an output of the second NAND gate ND2 to thereby output the band width read drive clock CKDRD11.

The write drive clock generator 160 includes the first inverter I1 for inverting the internal clock CKD, a third NAND gate ND3 for receiving an output of the first inverter I1 and the write enable signal WTEN, and a second inverter chain, provided with two inverters I6 and 17, for delaying an output of the third NAND gate ND3 to thereby output the write drive clock CKDWT.

The band width write drive clock generator 180 includes the first inverter I1 for inverting the internal clock CKD, the third NAND gate ND3 for receiving an output of the first inverter I1 and the write enable signal WTEN, a fourth NAND gate ND4 for receiving an output of the third NAND gate ND3 and the band width signal IOX4, and an eighth inverter I8 for inverting an output of the fourth NAND gate ND4 to thereby output the band width write drive clock CKDWT.

Hereinafter, the operation of the drive clock generator 100 is explained.

The read drive clock generator 120 outputs the read drive clock CKDRD of a logic high level when the first additive latency AL<0> becomes the logic high level. When the first additive latency AL<0> is inactive, the read drive clock generator 120 outputs the internal clock CKD as the read drive clock CKDRD. Herein, the read drive clock generator 120 receives the first additive latency AL<0>. When the additive latency AL is zero and, therefore, the first additive latency AL<0> becomes the logic high level, the read drive clock CKDRD holds the logic high level.

The band width read drive clock generator 140 outputs the internal clock CKD as the band width read drive clock CKDRD11 when the first additive latency AL<0> is inactive and the band width signal IOX4 is activated.

The write drive clock generator 160 outputs the write drive clock CKDWT of a logic high level when the write enable signal WTEN is inactive. When the write enable signal WTEN is activated, the write drive clock generator 160 outputs the internal clock CKD as the write drive clock CKDWT when the write enable signal WTEN is activated.

The band width write drive clock generator 180 outputs the internal clock CKD as the band width write drive clock CKDWT11 when the write enable signal WTEN and the band width signal IOX4 are activated.

Figure 5:
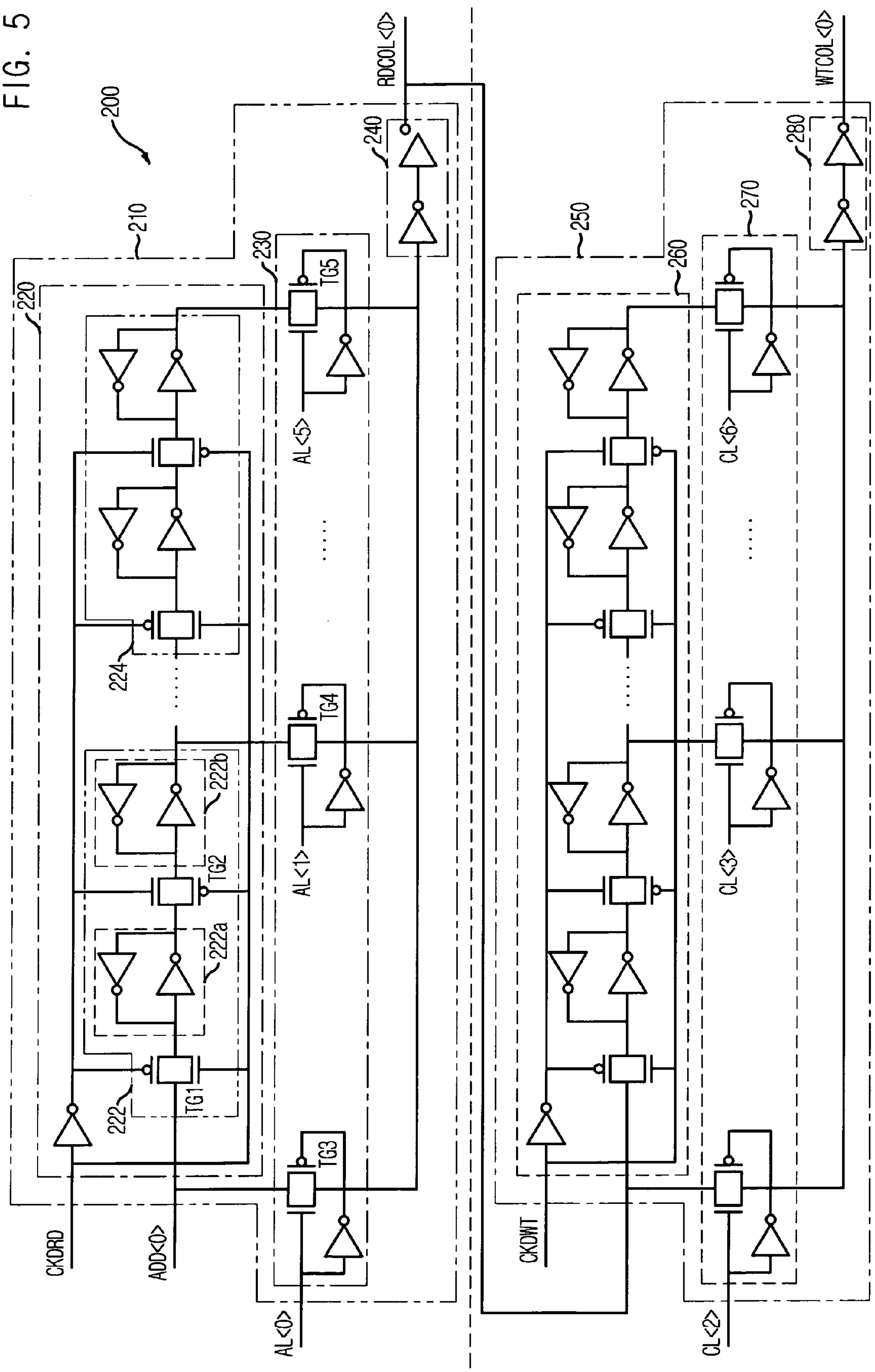
FIG. 5 is a schematic circuit diagram of a first column address generator shown in FIG. 3.

FIG. 5 is a schematic circuit diagram of the first column address generator 200 shown in FIG. 3.

The first column address generator 200 includes a read address generator 210 for generating a first read address RDCOL<0> by delaying the first address ADD<0> for a delay time determined by the additive latency AL<0:5> in response to the read drive clock CKDRD and a write address generator 250 for generating a first write address WTCOL<0> by delaying the first read address RDCOL<0> for a delay time determined by the CAS latency CL<2:6> in response to the write drive clock CKDWT.

The read address generator 210 includes a read delay unit 220, a read selection unit 230, and a read output unit 240. The read delay unit 220 delays the first address ADD<0> in response to the read drive clock CKDRD to thereby sequentially output a plurality of delay addresses ADD<0>_1 to ADD<0>_5. The read selection unit 230 selects one of the first address ADD<0> and the delay addresses ADD<0>_1 to ADD<0>_5 in response to the additive latency AL<0:5> in order to output as an additive address. The read output unit 240 latches the additive address to thereby output as the first read address RDCOL<0>.

The read delay unit 220 includes a plurality of flip-flops, e.g., 222, serially connected to one another. An output of the flip-flop, e.g., 222, is transmitted to the next flip-flop. The flip-flop, e.g., 222, includes a first and a second transfer gates TG1 and TG2, a first and a second latches **222*a* and 222*b*. The first transfer gate TG1 transmits an input address, e.g., ADD<0>, in response to the read drive clock CKDRD of a logic high level. The first latch 222*a* latches an output of the first transfer gate TG1. The second transfer gate TG2 transmits an output of the first latch 222*a* in response to the read drive clock CKDRD of a logic low level. The second latch 222*b* latches an output of the second transfer gate TG2**.

The read selection unit 230 includes a plurality of transfer gates, e.g., TG3, for transmitting one of the first address ADD<0> and the delay addresses ADD<0>_1 to ADD<0>_5 in response to an activation of a corresponding additive latency. The read output unit 240 is provided with an inverter chain for delaying the additive address to thereby output as the first read address RDCOL<0>.

The write address generator 250 includes a write delay unit 260, a write selection unit 270, and a write output unit 280. The write delay unit 260 delays the first read address RDCOL<0> in response to the write drive clock CKDWT to thereby sequentially output a plurality of delay read addresses. The write selection unit 270 selects one of the first read address RDCOL<0> and the delay read addresses in response to the CAS latency CL<2:6> in order to output as a CAS address. The write output unit 280 latches the CAS address to thereby output as the first write address WTCOL<0>.

The write address generator 250 has internal circuitry similar to that of the read address generator 210 except that the write address generator receives the write drive clock CKDWT, CAS latency CL<2:6>, and the first read address RDCOL<0> to thereby output the first write address WTCOL<0>.

Figure 1:
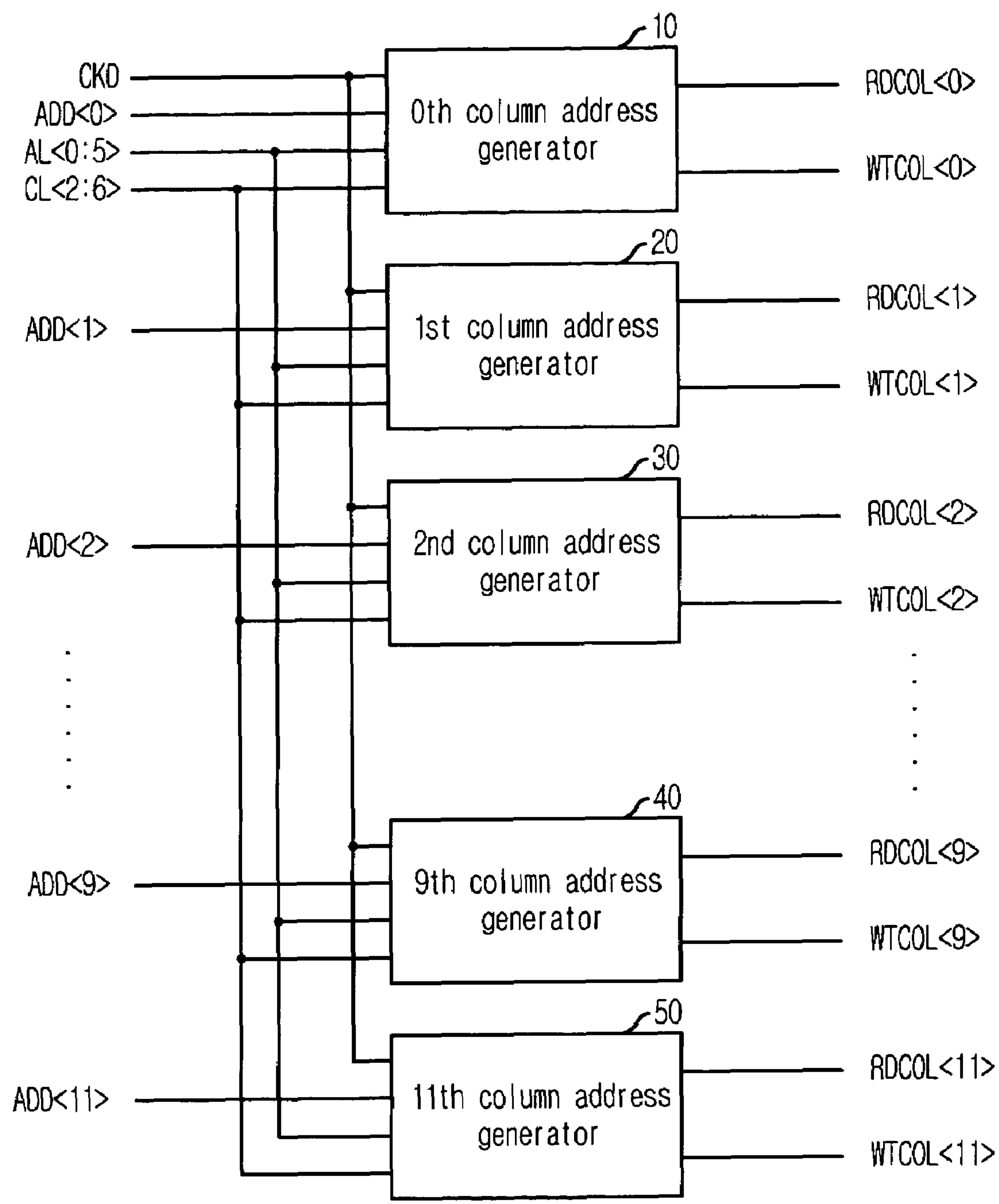
FIG. 1 is a block diagram of a conventional internal address generator.
Figure 2:
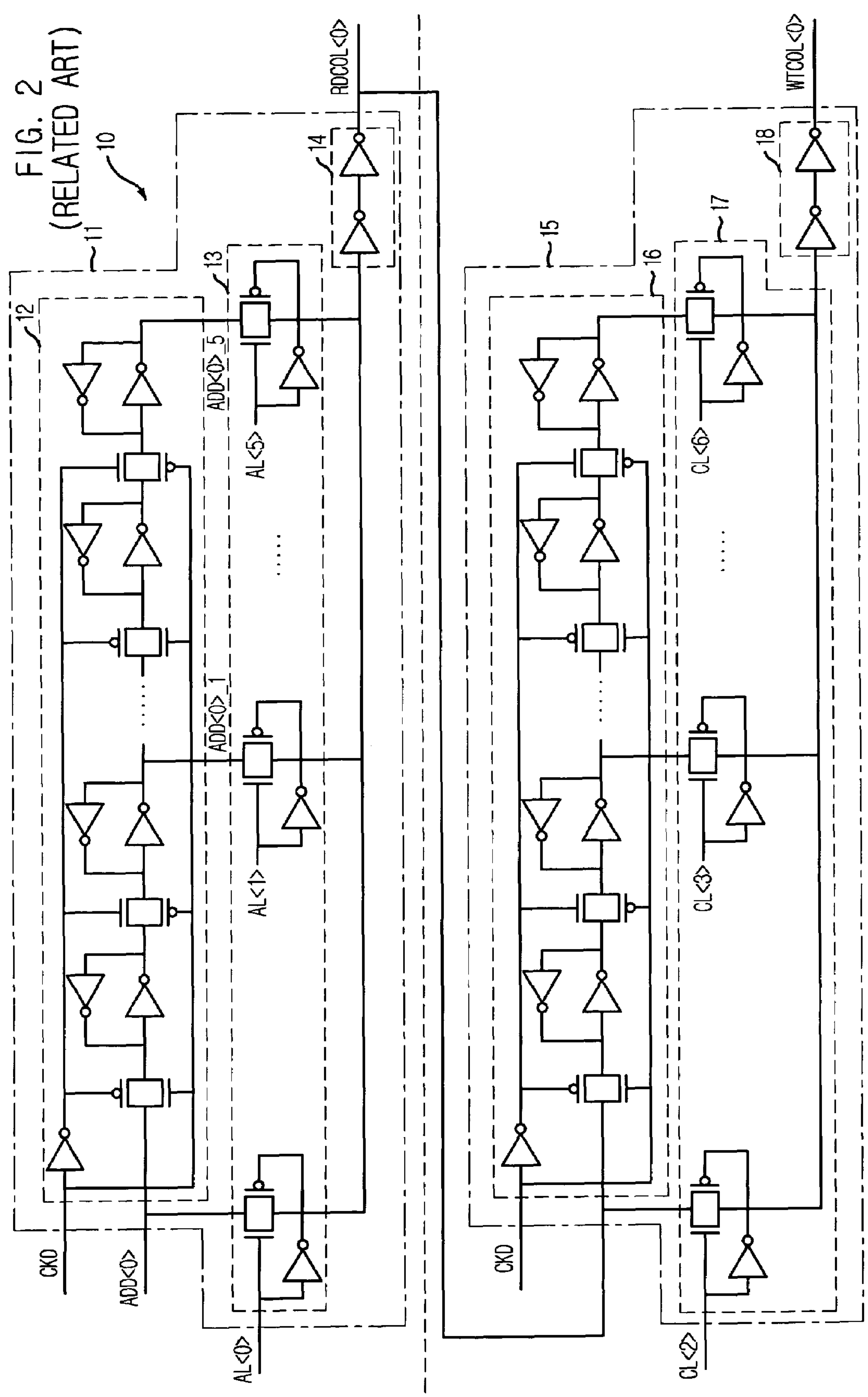
FIG. 2 is a schematic circuit diagram of a first column address generator shown in FIG. 1.

The other column address generators 300 to 500 have structure similar to that of the first column address generator 200 shown in FIG. 2.

Figure 6:
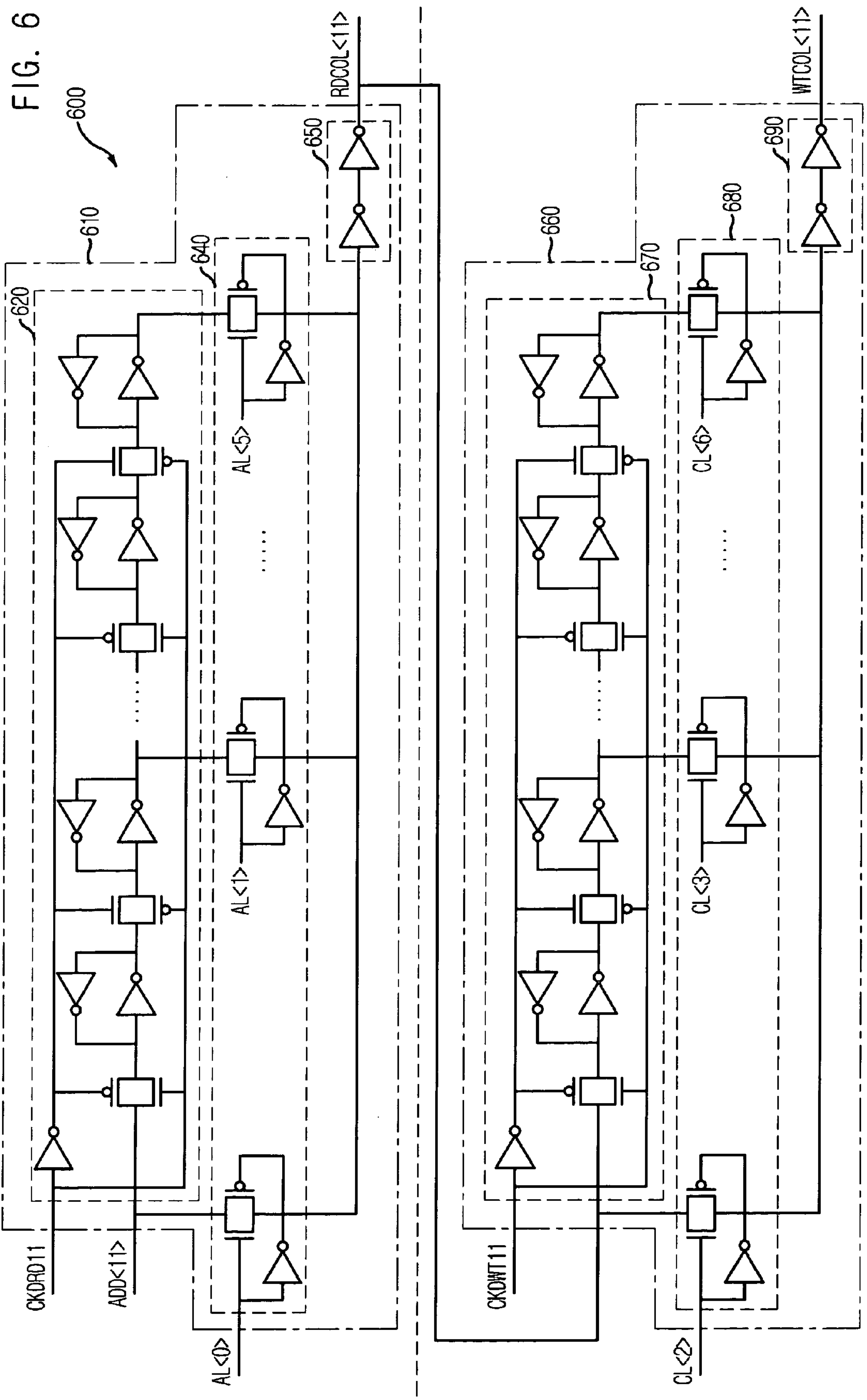
FIG. 6 is a schematic circuit diagram of a mode column address generator shown in FIG. 3.

FIG. 6 is a schematic circuit diagram of the mode column address generator 600 shown in FIG. 3.

As shown, the mode column address generator 600 has structure similar to the column address generators 200 to 500 except that the mode column address generator 600 receives twelfth address ADD<11> to thereby generate twelfth read address RDCOL<11> in response to the band width read drive clock CKDRD11 and to generate twelfth write address WTCOL<11> in response to the band width write drive clock CKDWT11.

Hereinafter, the operation of the column address generators 200 to 500 and the mode column address generator 600 is explained.

First, it is assumed that the additive latency AL is three, the CAS latency CL is five, the output mode is X16. When a write command is input with the first address ADD<0>, the first column address generator 200 generates the first write address WTCOL<0>. In order to generate the first write address WTCOL<0>, the drive clock generator 100 outputs the internal clock CKD as the read drive clock CKDRD in response to inactivation of the first active latency AL<0>. Further, the drive clock generator 100 outputs the internal clock CKD as the write drive clock CKDWT in response to activation of the write enable signal which is activated by the write command. Because the output mode is X16, the band width signal IOX4 is inactive. Therefore, the band width read drive clock CKDRD11 and the band width write drive clock CKDWT11 holds a logic low level.

The read delay unit 220 in the read address generator 210 generates the delay addresses in response to the read drive clock CKDRD. The read selection unit 230 selects the third delay address in response to the fourth additive latency AL<3>. The read output unit 240 outputs an output of the read selection unit 230 as the first read address RDCOL<0>.

The write delay unit 260 in the write address generator 250 generates the delay read addresses in response to the write drive clock CKDWT. The write selection unit 270 selects the third delay read address in response to the fourth CAS latency CL<5>. The write output unit 280 outputs an output of the write selection unit 270 as the first write address WTCOL<0>.

Meanwhile, the read delay unit 620 and the write delay unit 670 in the mode column address generator 600 receiving the twelfth address ADD<11> are not driven because the band width read drive clock CKDRD11 and the band width write drive clock CKDWT11 holds the logic low level.

When the output mode is X4, the band width IOX4 is activated. Therefore, the drive clock generator 100 outputs the internal clock CKD as the band width read clock CKDRD11 and the band width read clock CKDWT11. Thus, the mode column address generator 600 generates the twelfth write address WTCOL<11>.

Next, a read command is input with an address, and the internal address generator generates the read address RDCOL. Herein, it is assumed that the additive latency AL is zero and the output mode is X8. Therefore, the first additive latency AL<0> is activated as a logic high level and the other additive latencies AL<1:5> are inactivated as a logic low level.

Therefore, the drive clock generator 100 outputs the read drive clock CKDRD as a logic high level in response to the first additive logic AL<0>. Because the read command is input, the write enable signal WTEN is inactive. The drive clock generator 100 outputs the write drive clock CKDWT of logic high level in response to inactivation of the write enable signal WTEN. Further, because the output mode is X8, the band width signal IOX4 is inactive. The drive clock generator 100 outputs the band width read drive clock CKDRD11 and the band width write drive clock CKDWT11 of a logic low level.

Because the read drive clock CKDRD holds the logic high level, the read delay unit 220 in the first column address generator 200 is not driven and, therefore, the delay addresses are not generated. The read selection unit 230 selects and outputs the first address ADD<0> as the additive address. The read output unit 240 outputs the additive address as the first read address RDCOL<0>.

As described, the internal address generator turns off the read delay unit, e.g., 220, and the write delay unit, e.g., 260, in the column address generator, e.g., 200, by inactivating the read drive clock CKDRD and the write drive clock CKDWT when the additive latency is set to zero. In this way, the internal address generator reduces the power consumption.

If the additive latency AL is changed from zero to three, the drive clock generator 100 outputs the internal clock CKD as the read drive clock CKDRD in response to an inactivation of the first additive latency AL<0>. The drive clock generator 100 outputs the write drive clock CKDWT of logic high level in response to inactivation of the write enable signal WTEN. The drive clock generator 100 outputs the band width read drive clock CKDRD11 and the band width write drive clock CKDWT11 of a logic low level.

The read delay unit 220 in the first column address generator 200 generates the delay addresses in response to the read drive clock CKDRD. The read selection unit 230 selects and outputs the third delay address as the additive address in response to the fourth additive latency AL<3>. The read output unit 240 outputs the additive address as the first read address RDCOL<0>.

Herein, the write drive clock CKDWT holds the logic high level, the write delay unit 260 in the first column address generator 200 is not driven. That is, the internal address generator drives the write delay unit, e.g., 260, only when the write enable signal WTEN is activated. Therefore, the internal address generator reduces the power consumption.

Meanwhile, when the output mode changes to X4, the band width signal IOX4 is activated. Accordingly, the drive clock generator 100 outputs the internal clock CKD as the band width read drive clock CKDRD11. The mode column address generator 600 generates the twelfth read address RDCOL<11> in response to the band width read drive clock CKDRD11. That is, the internal address generator drives the mode column address generator 600 only when the band width signal IOX4 is activated, i.e., when the output mode is X4. Therefore, the internal address generator reduces the power consumption.

As above described, the internal address generator reduces power consumption by selectively activating drive clocks according to an operation mode, e.g., a read operation and a write operation, and an output mode.

The present application contains subject matter related to Korean patent application No. 2005-090860 and No. 2005-133961, filed in the Korean Patent Office on Sep. 28, 2005 and on Dec. 29, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal address generator, comprising:

a plurality of column address generators, each of which receives a corresponding address, an additive latency signal, and a column address strobe (CAS) latency signal and generates an internal read address in response to a read drive clock and an internal write address in response to a write drive clock;

a mode column address generator for receiving a corresponding address, the additive latency signal, and the CAS latency signal and generates a mode read address in response to a band width read drive clock and a mode write address in response to a band width write drive clock; and a drive clock generator for receiving an additive latency information signal, a band width signal, a write enable signal, and a clock and generates the read drive clock, the write drive clock, the band width read drive clock, and the band width write drive clock.

2. The internal address generator as recited in claim 1, wherein the band width signal determines the bit number of an output data outputted from a semiconductor memory device using the internal address generator.

3. The internal address generator as recited in claim 2, wherein the write enable signal is activated during a write operation.

4. The internal address generator as recited in claim 3, wherein the drive clock generator includes:

a read drive clock generator for outputting the read drive clock based on the clock in response to the additive latency information signal;

a band width read drive clock generator for outputting the band width read drive clock based on the clock in response to both of the additive latency information signal and the band width signal;

a write drive clock generator for outputting the write drive clock based on the clock in response to the write enable signal; and a band width write drive clock generator for outputting the band width write drive clock based on the clock in response to both of the additive latency information signal and the band width signal.

5. The internal address generator as recited in claim 4, wherein the read drive clock generator outputs the read drive clock of a first logic level when the additive latency information signal has the first logic level and outputs the clock as the read drive clock when the additive latency information signal is inactive.

6. The internal address generator as recited in claim 5, wherein the read drive clock generator includes:

a first inverter for inverting the clock;

a second inverter for inverting the additive latency information signal;

a logic gate for logically combining outputs of the first and the second inverters; and an inverter chain for delaying an output of the logic gate to thereby output the read drive clock.

7. The internal address generator as recited in claim 4, wherein the band width read drive clock generator outputs the clock as the band width read drive clock when the additive latency information signal is inactive and the band width signal is activated.

8. The internal address generator as recited in claim 7, wherein the band width read drive clock generator includes:

a first inverter for inverting the clock;

a second inverter for inverting the additive latency information signal;

a first logic gate for logically combining outputs of the first and the second inverters;

a second logic gate for logically combining an output of the first logic gate and the band width signal; and a third inverter for inverting an output of the second logic gate to output the band width read drive clock.

9. The internal address generator as recited in claim 4, wherein the write drive clock generator outputs the write drive clock of a first logic level when the write enable signal is inactive and outputs the clock as the write drive clock when the write enable signal is activated.

10. The internal address generator as recited in claim 9, wherein the write drive clock generator includes:

an inverter for inverting the clock;

a logic gate for logically combining an output of the inverter and the write enable signal; and an inverter chain for delaying an output of the logic gate to output the write drive clock.

11. The internal address generator as recited in claim 4, wherein the band width write drive clock generator outputs the clock as the band width write drive clock when both of the write enable signal and the band width signal are activated.

12. The internal address generator as recited in claim 11, wherein the band width write drive clock generator includes:

a first inverter for inverting the clock;

a first logic gate for logically combining an output of the first inverter and the write enable signal;

a second logic gate for logically combining an output of the first logic gate and the band width signal; and a second inverter for inverting an output of the second logic gate to output the band width write drive clock.

13. The internal address generator as recited in claim 3, wherein each of the column address generators includes:

a read address generator for generating the internal read address by delaying the corresponding address as long as a delay time determined by the additive latency signal in response to the read drive clock; and a write address generator for generating the internal write address by delaying the internal read address as long as a delay time determined by the CAS latency signal in response to the write drive clock.

14. The internal address generator as recited in claim 13, wherein the read address generator includes:

a read delay unit for delaying the corresponding address in response to the read drive clock to thereby sequentially output a plurality of delay read addresses;

a read selection unit for selecting one of the corresponding address and the delay read addresses in response to the additive latency signal in order to output an additive address; and a read output unit for latching the additive address to output the internal read address.

15. The internal address generator as recited in claim 14, wherein the read delay unit includes a plurality of flip-flops connected in series.

16. The internal address generator as recited in claim 15, wherein each of the flip-flops includes:

a first transfer gate for transmitting the corresponding address in response to the read drive clock of a first logic level;

a first latch for latching an output of the first transfer gate;

a second transfer gate for transmitting an output of the first latch in response to the read drive clock of a second logic level; and a second latch for latching an output of the second transfer gate.

17. The internal address generator as recited in claim 14, wherein the read selection unit includes a plurality of transfer gates for transmitting one of the corresponding address and the delay read addresses in response to the additive latency signal.

18. The internal address generator as recited in claim 14, wherein the read output unit includes an inverter chain for delaying the additive address and outputting the delayed additive address as the internal read address.

19. The internal address generator as recited in claim 13, wherein the write address generator includes:

a write delay unit for delaying the internal read address in response to the write drive clock to thereby sequentially output a plurality of delay write addresses;

a write selection unit for selecting one of the internal read address and the delay write addresses in response to the CAS latency signal in order to output a CAS address; and a write output unit for latching the CAS address to output the internal write address.

20. The internal address generator as recited in claim 3, wherein the mode column address generator includes:

a mode read address generator for generating the mode read address by delaying the corresponding address as long as a delay time determined by the additive latency signal in response to the band width read drive clock; and a mode write address generator for generating the mode write address by delaying the mode read address as long as a delay time determined by the CAS latency signal in response to the band width write drive clock.

21. The internal address generator as recited in claim 5, wherein the band width read drive clock generator outputs the clock as the band width read drive clock when the additive latency information signal is inactivated and the band width signal is activated.

22. The internal address generator as recited in claim 21, wherein the write drive clock generator outputs the write drive clock of the first logic level when the write enable signal is inactivated and outputs the clock as the write drive clock when the write enable signal is activated.

23. The internal address generator as recited in claim 22, wherein the band width write drive clock generator outputs the clock as the band width write drive clock when both of the write enable signal and the band width signal are activated.

24. The internal address generator as recited in claim 23, wherein each of the column address generators includes:

a read address generator for generating the internal read address by delaying the corresponding address as long as a time delay determined by the additive latency signal in response to the read drive clock; and a write address generator for generating the internal write address by delaying the internal read address as long as a delay time determined by the CAS latency signal in response to the write drive clock.

25. The internal address generator as recited in claim 24, wherein the mode column address generator includes:

a mode read address generator for generating the mode read address by delaying the corresponding address as long as a delay time determined by the additive latency signal in response to the band width read drive clock; and a mode write address generator for generating the mode write address by delaying the mode read address as long as a delay time determined by the CAS latency signal in response to the band width write drive clock.

* * * * *